US010825711B2

(12) United States Patent
Kakiuchi et al.

(10) Patent No.: US 10,825,711 B2
(45) Date of Patent: Nov. 3, 2020

(54) SHEET FOR SEMICONDUCTOR PROCESSING

(71) Applicant: LINTEC CORPORATION, Itabashi-ku (JP)

(72) Inventors: Yasuhiko Kakiuchi, Warabi (JP); Takashi Akutsu, Saitama (JP); Sayaka Bandou, Tokorozawa (JP); Yuichiro Komasu, Kita (JP)

(73) Assignee: LINTEC CORPORATION, Itabashi-ku (JP)

( * ) Notice: Subject to any disclaimer, the term of this patent is extended or adjusted under 35 U.S.C. 154(b) by 39 days.

(21) Appl. No.: 15/764,377

(22) PCT Filed: Mar. 28, 2016

(86) PCT No.: PCT/JP2016/059803
§ 371 (c)(1),
(2) Date: Mar. 29, 2018

(87) PCT Pub. No.: WO2017/061132
PCT Pub. Date: Apr. 13, 2017

(65) Prior Publication Data
US 2018/0286736 A1 Oct. 4, 2018

(30) Foreign Application Priority Data
Oct. 5, 2015 (JP) ................. 2015-197534

(51) Int. Cl.
H01L 21/304 (2006.01)
C09J 133/08 (2006.01)
C09J 133/14 (2006.01)
C09J 7/38 (2018.01)
C09J 7/20 (2018.01)
C09J 7/29 (2018.01)
B32B 27/36 (2006.01)
B32B 27/32 (2006.01)
C08F 220/18 (2006.01)
C08F 220/20 (2006.01)
H01L 21/683 (2006.01)
C09J 153/00 (2006.01)
C09J 133/06 (2006.01)
C08F 293/00 (2006.01)

(52) U.S. Cl.
CPC .......... *H01L 21/6836* (2013.01); *B32B 27/32* (2013.01); *B32B 27/36* (2013.01); *C08F 220/18* (2013.01); *C08F 220/1804* (2020.02); *C08F 220/20* (2013.01); *C08F 293/005* (2013.01); *C09J 7/20* (2018.01); *C09J 7/29* (2018.01); *C09J 7/385* (2018.01); *C09J 7/387* (2018.01); *C09J 133/066* (2013.01); *C09J 133/08* (2013.01); *C09J 133/14* (2013.01); *C09J 153/00* (2013.01); *H01L 21/304* (2013.01); *B32B 2250/02* (2013.01); *B32B 2250/24* (2013.01); *C09J 2201/606* (2013.01); *C09J 2201/622* (2013.01); *C09J 2203/326* (2013.01); *C09J 2205/31* (2013.01); *C09J 2423/006* (2013.01); *C09J 2433/00* (2013.01); *C09J 2453/00* (2013.01); *C09J 2467/006* (2013.01); *C09J 2475/003* (2013.01); *H01L 2221/68381* (2013.01)

(58) Field of Classification Search
None
See application file for complete search history.

(56) References Cited

U.S. PATENT DOCUMENTS

| 6,602,599 B1 * | 8/2003 | Toyoda ............... H01L 21/6836 428/355 AC |
| 2007/0231570 A1 * | 10/2007 | Tanaka ...................... C09J 7/29 428/343 |
| 2009/0123746 A1 | 5/2009 | Tanaka et al. |
| 2011/0030882 A1 | 2/2011 | Mizuno et al. |
| 2015/0255321 A1 * | 9/2015 | Tominaga ........... H01L 21/6836 428/198 |

FOREIGN PATENT DOCUMENTS

| JP | 2002-203827 A | 7/2002 |
| JP | 2005-48039 A | 2/2005 |
| JP | 2009-138183 A | 6/2009 |
| JP | 2011-119548 A | 6/2011 |
| JP | 5019434 B2 | 9/2012 |
| JP | 5069662 B2 | 11/2012 |
| JP | 2013-87131 A | 5/2013 |

(Continued)

OTHER PUBLICATIONS

Combined Office Action and Search Report dated Jul. 12, 2019 in Taiwanese Patent Application No. 105109719 (with English translation of categories of cited documents) ), citing document AO therein, 7 pages.

(Continued)

*Primary Examiner* — Frank D Ducheneaux
(74) *Attorney, Agent, or Firm* — Oblon, McClelland, Maier & Neustadt, L.L.P.

(57) ABSTRACT

The sheet for semiconductor processing of the present invention includes a base, an unevenness-absorbing layer provided on one surface of the base, and a pressure sensitive adhesive layer provided on the unevenness-absorbing layer, wherein the pressure sensitive adhesive layer is composed of an energy ray-curable pressure sensitive adhesive, and a stress at rupture of the pressure sensitive adhesive layer after energy ray curing is 10 MPa or more.

7 Claims, No Drawings

(56) References Cited

FOREIGN PATENT DOCUMENTS

| | | | |
|---|---|---|---|
| JP | 2014-017336 | A | 1/2014 |
| JP | 2014-63803 | A | 4/2014 |
| JP | 2015-124301 | A | 7/2015 |
| TW | 201117279 | A1 | 5/2011 |
| WO | WO-2014046096 | A1 * | 3/2014 |

OTHER PUBLICATIONS

International Search Report dated Jun. 21, 2016 in PCT/JP2016/059803 filed Mar. 28, 2016.
Japanese Office Action dated Mar. 3, 2020 in Japanese Patent Application No. 2017-544379 (with unedited computer generated English translation), citing documents AO through AR therein, 8 pages.

* cited by examiner

SHEET FOR SEMICONDUCTOR PROCESSING

CROSS-REFERENCE TO RELATED APPLICATIONS

This application is a National Stage of PCT/JP2016/059803, which was filed on Mar. 28, 2016. This application is based upon and claims the benefit of priority to Japanese Application No. 2015-197534, which was filed on Oct. 5, 2015.

TECHNICAL FIELD

The present invention relates to a sheet for semiconductor processing, and in more detail, the invention relates to a back grinding sheet which at the time of grinding the back surface of a wafer, is stuck onto the semiconductor wafer surface and used.

BACKGROUND ART

Amid the rapid advance of thinning, miniaturization, and multi-functionalization of information terminal devices, semiconductor devices to be mounted thereon are similarly required to achieve thinning and densification. For the purpose of achieving thinning of the device, thinning of a semiconductor wafer with which semiconductors are integrated is demanded, too. Accordingly, the back surface of the semiconductor wafer is occasionally ground and thinned.

In addition, on the wafer surface, bumps (electrodes) made of solder or the like are formed, and an uneven portion is frequently included. In the case where such a bump-provided semiconductor wafer is subjected to back surface grinding, in order to protect the surface having a bump portion, a sheet for semiconductor processing is stuck onto the wafer surface. As the sheet for semiconductor processing, conventionally, it is general to use a pressure sensitive adhesive sheet including a base and a pressure sensitive adhesive layer provided on one surface of the base. In addition, it is known that the pressure sensitive adhesive layer is made energy ray-curable, and an energy ray is irradiated prior to releasing the sheet for semiconductor processing from the wafer surface to reduce the adhesive strength, thereby making a release performance good.

On releasing the pressure sensitive adhesive sheet which is used as the sheet for semiconductor processing from the semiconductor wafer, it is required to not remain the adhesive (namely, cause adhesive residue) in the bump portion. For that reason, as described in PTL 1, it is conventionally known that a pressure sensitive adhesive layer is prepared as an energy ray-curable pressure sensitive adhesive layer, and a pressure sensitive adhesive containing an energy ray-curable acrylic copolymer and an energy ray-curable urethane acrylate is used to improve tensile properties, thereby preventing the adhesive residue to be caused due to rupture of the pressure sensitive adhesive from occurring. In addition, PTL 2 discloses that a stratiform clay mineral is added to a pressure sensitive adhesive layer and oriented in a vertical direction to a base, thereby increasing the rupture strength of the pressure sensitive adhesive layer.

CITATION LIST

Patent Literature

PTL 1: Japanese Patent 5069662
PTL 2: Japanese Patent 5019434

SUMMARY OF INVENTION

Technical Problem

In semiconductor devices, densification is required from year to year. For that reason, the bump height is becoming high, and a gap between bumps (hereinafter also referred to as "pitch") is becoming narrower. However, as for semiconductor wafer with a narrow pitch and a high bump, when releasing the sheet for semiconductor processing, the release strength in a bump part becomes high, whereby the adhesive residue on the wafer surface is liable to be much more generated.

Furthermore, in the semiconductor wafer with a narrow pitch and a high bump, a clearance is readily generated between the bump and the pressure sensitive adhesive layer. The pressure sensitive adhesive layer in the surroundings of bumps comes into contact with air due to the clearance, and therefore, energy ray curing is sometimes not thoroughly advanced due to oxygen inhibition. In consequence, even if the tensile strength of the pressure sensitive adhesive layer is made high as in PTLs 1 and 2, in the surroundings of bumps, when releasing the sheet for semiconductor processing, rupture of the pressure sensitive adhesive layer is sometimes generated due to curing failure, thereby causing adhesive residue.

In view of the forgoing circumstances, the present invention has been made, and a problem of the present invention is to make it hard to cause adhesive residue on a workpiece, such as a semiconductor wafer, etc., on releasing a sheet for semiconductor processing from the workpiece, such as a semiconductor wafer, etc., even when a relatively large uneven portion is existent with a narrow pitch on the workpiece.

Solution to Problem

As a result of extensive and intensive investigations made by the present inventors, it has been found that the aforementioned problem can be solved by allowing a sheet for semiconductor processing to have a layer constitution in which an unevenness-absorbing layer and a pressure sensitive adhesive layer are provided in this order on one surface of a base, making the pressure sensitive adhesive layer energy ray-curable, and regulating a stress at rupture after energy ray curing to a predetermined value or more, thereby leading to accomplishment of the present invention. The present invention provides the following (1) to (8).

(1) A sheet for semiconductor processing, including a base, an unevenness-absorbing layer provided on one surface of the base, and a pressure sensitive adhesive layer provided on the unevenness-absorbing layer, wherein
the pressure sensitive adhesive layer is composed of an energy ray-curable pressure sensitive adhesive, and a stress at rupture of the pressure sensitive adhesive layer after energy ray curing is 10 MPa or more.
(2) The sheet for semiconductor processing as set forth in the above (1), wherein an elongation at rupture of the pressure sensitive adhesive layer after energy ray curing is 30% or more.
(3) The sheet for semiconductor processing as set forth in the above (1) or (2), wherein the energy ray-curable pressure sensitive adhesive contains an acrylic polymer.
(4) The sheet for semiconductor processing as set forth in the above (3), wherein a molecular weight distribution (Mw/Mn) of the acrylic polymer is 3.0 or less.

(5) The sheet for semiconductor processing as set forth in any one of the above (1) to (4), wherein the energy ray-curable pressure sensitive adhesive contains an energy-ray curable polymer as a main polymer per se contained in the pressure sensitive adhesive.
(6) The sheet for semiconductor processing as set forth in any one of the above (1) to (5), wherein a storage elastic modulus of the unevenness-absorbing layer at 60° C. is from 0.001 to 0.5 MPa.
(7) The sheet for semiconductor processing as set forth in any one of the above (1) to (6), wherein a storage elastic modulus of the unevenness-absorbing layer at 25° C. is from 4.5 to 65 MPa.
(8) The sheet for semiconductor processing as set forth in any one of the above (1) to (7), which is a back grinding sheet.

Advantageous Effects of Invention

The present invention provides a sheet for semiconductor processing capable of appropriately preventing adhesive residue when released from a workpiece, such as a semiconductor wafer, etc., from occurring.

DESCRIPTION OF EMBODIMENTS

In the following description, the terms "weight average molecular weight (Mw)" and "number average molecular weight (Mn)" are each a value expressed in terms of polystyrene as measured by the gel permeation chromatography (GPC) and specifically, a value measured on the basis of the method as described in the Examples.

In addition, in the description of the present specification, for example, the term "(meth)acrylate" is used as a term expressing both "acrylate" and "methacrylate", and the same is also applicable to other analogous terms.

[Sheet for Semiconductor Processing]

The sheet for semiconductor processing of the present invention includes a base, an unevenness-absorbing layer provided on one surface of the base, and a pressure sensitive adhesive layer provided on the unevenness-absorbing layer. The sheet for semiconductor processing may be constituted of these three members, or may be further provided with other layer. For example, the sheet for semiconductor processing may also be one further having a release material on the pressure sensitive adhesive layer. The release material is one to be stuck to the pressure sensitive adhesive layer for the purpose of protecting the pressure sensitive adhesive layer of the sheet for semiconductor processing.

The respective members constituting the sheet for semiconductor processing are hereunder described in more detail.

<Pressure Sensitive Adhesive Layer>

The pressure sensitive adhesive layer of the present invention is made of an energy ray-curable pressure sensitive adhesive and is one in which a stress at rupture thereof after energy ray curing is 10 MPa or more. In the present invention, when the pressure sensitive adhesive layer provided on the unevenness-absorbing layer is made of an energy ray-curable pressure sensitive adhesive, and its stress at rupture after energy ray curing is 10 MPa or more, the rupture of the pressure sensitive adhesive layer is prevented from occurring, whereby the adhesive residue on a workpiece, such as a semiconductor wafer, etc., may be effectively prevented from occurring.

On the other hand, when the stress at rupture is less than 10 MPa, on releasing the sheet for semiconductor processing from the workpiece, such as a semiconductor wafer, etc., the pressure sensitive adhesive layer is ruptured, whereby the adhesive residue is liable to be generated. From the viewpoint of more effectively preventing the adhesive residue from occurring, the stress at rupture is preferably 12 MPa or more, and more preferably 16 MPa or more. In addition, the stress at rupture of the pressure sensitive adhesive layer is preferably 30 MPa or less, and more preferably 25 MPa or less. By regulating the stress at rupture to such an upper limit value or less, a pressure sensitive adhesion performance or the like of the pressure sensitive adhesive layer is readily exhibited.

It is preferred that the pressure sensitive adhesive layer has an elongation at rupture after energy ray curing is 30% or more. When the elongation at rupture is 30% or more, the adhesive residue at the time of rupture is readily prevented from occurring. In addition, though an upper limit of the elongation at rupture is not particularly limited, from the standpoint of characteristics of the pressure sensitive adhesive layer is typically 120% or less, and preferably 100% or less.

The stress at rupture and the elongation at rupture are each a value obtained by producing a sample made of a pressure sensitive adhesive after energy ray curing and measuring the sample in conformity with JIS K7127 (1999).

Furthermore, a storage elastic modulus of the pressure sensitive adhesive layer at 23° C. is preferably $1.0 \times 10^3$ to $1.0 \times 10^7$ Pa, and more preferably $1.0 \times 10^4$ to $1.0 \times 10^6$ Pa. By allowing the storage elastic modulus to fall within such a range, the pressure sensitive adhesive layer has an appropriate pressure sensitive adhesive strength, and it becomes possible to appropriately adhere to a workpiece, such as a semiconductor wafer, etc. The storage elastic modulus is one obtained by measuring the pressure sensitive adhesive layer before energy ray curing by the method of the Examples as described later.

Though the pressure sensitive adhesive which forms the pressure sensitive adhesive layer is not particularly limited, examples thereof include an acrylic pressure sensitive adhesive, a rubber-based pressure sensitive adhesive, a silicone-based pressure sensitive adhesive, a polyester-based pressure sensitive adhesive, a polyamide-based pressure sensitive adhesive, a urethane-based pressure sensitive adhesive, a fluorine-based pressure sensitive adhesive, a styrene-diene block copolymer-based pressure sensitive adhesive, and the like. Among those, an acrylic pressure sensitive adhesive is preferred.

In general, though examples of the energy ray-curable pressure sensitive adhesive include (1) one containing, besides a non-energy ray-curable main polymer, an energy ray-curable compound as a compound other than the main polymer (hereinafter also referred to as "I type"); (2) one containing an energy-ray curable polymer as a main polymer per se contained in the pressure sensitive adhesive (hereinafter also referred to as "II type"); and (3) a combination of the I type and the II type, namely one containing, in addition to an energy ray-curable main polymer, an energy ray-curable compound other than the main polymer (hereinafter also referred to as "I-II type"), a pressure sensitive adhesive of the II type is preferred in the present invention. In the case of such a pressure sensitive adhesive, on preparing a coating composition of the pressure sensitive adhesive, it is not necessary to blend a plenty of components for energy ray curing other than the main polymer. Therefore, an operation for preparing the coating composition may be simplified. In addition, the components constituting the pressure sensitive adhesive are hard to transfer into another layer, such as a base, an adherend, etc., a concern about contamination becomes scarce, and for example, a stain-like residue as described later, or the like is hardly generated. Examples of the energy ray-curable main polymer include one having an unsaturated group introduced into a side chain of the polymer.

The main polymer as referred to herein broadly include not only a resin in which its polymer per se has pressure sensitive adhesion but also a resin which does not substantially reveal pressure sensitive adhesion only by its polymer but reveals the pressure sensitive adhesion upon addition of a plasticizing component, etc., and so on. Though the specific main polymer varies with the kind of the aforementioned pressure sensitive adhesive, examples thereof include an acrylic polymer, a rubber component, a silicone resin, a polyester, a polyamide, a polyurethane, a fluorine-based resin, and a styrene-diene block copolymer. These components may be used either alone or in a mixture of two or more thereof. In the present specification, the acrylic polymer means a polymer containing a constitutional unit derived from a (meth)acrylic acid ester.

(Acrylic Pressure Sensitive Adhesive)

The case where the pressure sensitive adhesive is an acrylic pressure sensitive adhesive is hereunder described in detail.

The acrylic pressure sensitive adhesive of the present invention is one containing an acrylic polymer. As described above, the acrylic pressure sensitive adhesive is energy ray-curable and is preferably a pressure sensitive adhesive of the II type as described above. Though the pressure sensitive adhesive of the II type is typically one not containing an energy ray-curable compound other than the main polymer (acrylic polymer), there is a case where an unreacted product of an unsaturated group-containing compound (C) working as a raw material of the main polymer as described later, or a compound derived from the component (C) is inevitably incorporated thereinto.

The acrylic polymer is preferably an acrylic polymer ($\beta$) in which in a block copolymer ($\alpha$) having a structure represented by the following general formula (1), in which a polymer block (B) having reactive functional groups is bound to both ends of an acrylic polymer block (A), the unsaturated group-containing compound (C) is bound to the reactive functional groups of the block (B), whereby an unsaturated group is introduced into a side chain thereof. It is preferred that a part of the reactive functional groups of the block (B) remains while the unsaturated group-containing compound is not bound thereto. The remaining reactive functional groups are able to work as a crosslinking point with a crosslinking agent (D) as described later.

In the present specification, the block copolymer ($\alpha$) and the blocks (A) and (B) mean a block copolymer before the unsaturated group-containing compound (C) is bound and a block, respectively. In addition, in the case of referring to the acrylic polymer ($\beta$), it is meant that the unsaturated group-containing compound (C) is bound to the block copolymer ($\alpha$).

$$(B)\text{-}(A)\text{-}(B) \qquad (1)$$

In the acrylic polymer ($\beta$), the ends of the polymer or their neighborhoods work as a starting point of crosslinking and energy ray curing. Accordingly, on performing crosslinking and energy ray curing, a network structure is formed by a polymer having a relatively long chain, whereby it becomes possible to regulate the stress at rupture and the elongation at rupture of the pressure sensitive adhesive layer to high values as described above.

A constitutional unit constituting the block (A) is contained in an amount of preferably 50 to 98% by mass, more preferably 60 to 95% by mass, and still more preferably 70 to 90% by mass relative to all of constitutional units constituting the block copolymer ($\alpha$). On the other hand, constitutional units constituting the respective block (B) are each contained in an amount of preferably 1 to 25% by mass, more preferably 2.5 to 20% by mass, and still more preferably 5 to 15% by mass relative to all of constitutional units constituting the block copolymer ($\alpha$).

By allowing the amounts of the blocks (A) and (B) to fall within the aforementioned ranges, it becomes possible to regulate the stress at rupture and the elongation at rupture of the pressure sensitive adhesive layer to high values as described above.

(Acrylic Polymer Block (A))

The acrylic polymer block (A) is a block of a polymer containing a constitutional unit derived from a (meth)acrylic acid ester and specifically, is one resulting from polymerizing an alkyl (meth)acrylate (A1) or polymerizing an alkyl (meth)acrylate (A1) with other monomer (A2). The other monomer (A2) is a monomer not containing a reactive functional group as described later. In the case where the acrylic polymer block (A) is a copolymer of two or more monomers, though those monomers may be polymerized in a block, it is preferred that they are randomly polymerized.

As the alkyl (meth)acrylate (A1), those in which a carbon number of the alkyl group is 1 to 18 are exemplified, and the alkyl group may be either linear or branched. Specific examples of the alkyl (meth)acrylate (A1) include methyl (meth) acrylate, ethyl (meth) acrylate, n-propyl (meth) acrylate, isopropyl (meth) acrylate, n-butyl (meth) acrylate, isobutyl (meth) acrylate, t-butyl (meth)acrylate, n-pentyl (meth)acrylate, n-hexyl (meth)acrylate, 2-ethylhexyl (meth) acrylate, isooctyl (meth)acrylate, n-octyl (meth)acrylate, n-nonyl (meth) acrylate, isononyl (meth) acrylate, n-decyl (meth) acrylate, lauryl (meth) acrylate, myristyl (meth) acrylate, palmityl (meth) acrylate, stearyl (meth)acrylate, and the like.

The acrylic polymer block (A) is one composed mainly of a constitutional unit derived from the alkyl (meth)acrylate (A1). Specifically, the constitutional unit derived from the alkyl (meth)acrylate (A1) is contained in an amount of 70 to 100% by mass, preferably 80 to 100% by mass, and more preferably 90 to 100% by mass relative to all of constitutional units constituting the block (A).

The alkyl (meth)acrylate (A1) preferably contains an alkyl (meth)acrylate in which a carbon number of the alkyl group is 1 to 10, and more preferably contains an alkyl (meth)acrylate in which a carbon number of the alkyl group is 1 to 4. When the block (A) contains a constitutional unit derived from an alkyl (meth)acrylate in which a carbon number of the alkyl group is 1 to 4, it becomes possible to improve the stress at rupture and the elongation at rupture while keeping pressure sensitive adhesion characteristics of the pressure sensitive adhesive layer favorable.

Though an alkyl (meth)acrylate in which a carbon number of the alkyl group is 5 or more may become a factor of worsening the stress at rupture and the elongation at rupture, by jointly using an alkyl (meth)acrylate in which a carbon number of the alkyl group is 1 to 4, it becomes easy to keep the stress at rupture and the elongation at rupture at favorable values.

The constitutional unit derived from an alkyl (meth) acrylate in which a carbon number of the alkyl group is 1 to 4 is contained in an amount of preferably 50 to 100% by mass, more preferably 70 to 100% by mass, and still more preferably 90 to 100% by mass relative to all of constitutional units of the block (A).

As the alkyl (meth)acrylate in which a carbon number of the alkyl group is 1 to 4, methyl (meth)acrylate and a variety of butyl (meth)acrylates are preferred, and single use of a butyl (meth)acrylate or joint use of a butyl (meth)acrylate and methyl (meth)acrylate is more preferred. In addition, as the butyl (meth)acrylate, a variety of butyl acrylates are still more preferred.

In the case of joint use of a butyl (meth)acrylate and methyl (meth)acrylate, in the block (A), it is preferred that a proportion of the constitutional unit derived from the butyl (meth)acrylate is larger than that of the constitutional unit derived from methyl (meth)acrylate. A specific mass ratio [(butyl (meth)acrylate)/(methyl (meth)acrylate)] is preferably 2/1 to 30/1, more preferably 3/1 to 25/1, and still more preferably 10/1 to 20/1.

The other monomer (A2) constituting the block (A) is a monomer not containing a reactive functional group as described above. Specifically, examples thereof include (meth)acrylates having a cyclic skeleton, such as a cycloalkyl (meth)acrylate in which a carbon number of the cycloalkyl group is 3 to 20, benzyl (meth) acrylate, isobornyl (meth)acrylate, dicyclopentanyl (meth) acrylate, dicyclopentenyl (meth)acrylate, dicyclopentenyloxyethyl (meth) acrylate, etc.; acrylamide compounds, such as acrylamide, N-methylacrylamide, N,N-dimethylacrylamide, etc.; vinyl ester compounds, such as vinyl acetate, vinyl propionate, etc.; olefins, such as ethylene, propylene, isobutylene, etc.; halogenated olefins, such as vinyl chloride, vinylidene chloride, etc.; styrene-based monomers, such as styrene, α-methylstyrene, etc.; diene-based monomers, such as butadiene, isoprene, chloroprene, etc.; nitrile-based monomers, such as acrylonitrile, methacrylonitrile, etc.; and the like.

(Polymer Block (B))

The polymer block (B) is one resulting from polymerizing a functional group-containing monomer (B1) having a reactive functional group or polymerizing a functional group-containing monomer (B1) with other monomer (B2). The reactive functional group means a functional group which reacts with at least one of an unsaturated group-containing compound (C) and a crosslinking agent (D) as described later, and specifically, examples thereof include a hydroxy group, a carboxy group, and an epoxy group. Among those, a hydroxy group is preferred. In the case where the polymer block (B) is a copolymer of two or more monomers, though those monomers may be polymerized in a block, they are preferably randomly polymerized.

Examples of the functional group-containing monomer (B1) include hydroxy group-containing (meth)acrylates, such as hydroxymethyl (meth)acrylate, 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, etc.; epoxy group-containing (meth)acrylates, such as glycidyl (meth)acrylate, β-methylglycidyl (meth) acrylate, (3,4-epoxycyclohexyl)methyl (meth)acrylate, 3-epoxycyclo-2-hydroxypropyl (meth)acrylate, etc.; ethylenically unsaturated carboxylic acids, such as acrylic acid, methacrylic acid, crotonic acid, maleic acid, itaconic acid, citraconic acid, etc.; and the like.

Among those, hydroxy group-containing (meth)acrylates are preferred from the standpoint that the reactivity with the unsaturated group-containing compound (C) and the crosslinking agent (D) as described later is excellent.

The other monomer (B2) means a monomer component other than the functional group-containing monomer (B1), and specifically, one properly selected from the monomers enumerated in the aforementioned alkyl (meth)acrylate (A1) and other monomer (A2) has only to be used.

The polymer block (B) is one composed mainly of a constitutional unit derived from the functional group-containing monomer (B1). Specifically, in the respective block (B), the constitutional unit derived from the functional group-containing monomer (B1) is contained in an amount of 70 to 100% by mass, preferably 80 to 100% by mass, and more preferably 90 to 100% by mass relative to all of constitutional units constituting the respective block (B).

Specific examples of the block copolymer represented by the general formula (1) include ones in which the acrylic polymer block (A) is composed of a polymer of an alkyl (meth)acrylate in which a carbon number of the alkyl group is 1 to 10, and all of the polymer blocks (B) are composed of a polymer of a hydroxy group-containing (meth)acrylate. Among those, a block copolymer in which the alkyl (meth) acrylate is one in which a carbon number of the alkyl group is 1 to 4 is more preferred.

In producing the block copolymer (α), though the production may be performed by a usual free radical polymerization method, it is preferred to perform the production by a living radical polymerization method especially from the viewpoint that the block structure may be readily controlled. The living radical polymerization is radical polymerization in which activity of the polymer terminal is kept without being lost, and examples thereof include polymerization of using a radical scavenger, such as a cobalt porphyrin complex, a nitroxide compound, etc.; atom transfer radical polymerization (ATRP polymerization) using an organic halide, etc. as an initiator and a transition metal complex as a catalyst; reversible addition fragmentation chain transfer polymerization (RAFT polymerization) in which the polymerization is performed in the presence of an RAFT initiator; and the like. Among those, ATRP polymerization and RAFT polymerization are preferred.

As the initiator which is used for the ATRP polymerization, α-bromostyrene is exemplified.

Examples of the RAFT initiator include bis(thiocarbonyl) disulfides, such as bis(thiobenzoyl) disulfide, bis(dodecylsulfanylthiocarbonyl) disulfide, etc.; trithiocarbonates, such as 2-cyano-2-propyl-dodecyltrithiocarbonate, 4-cyano-4-[(dodecylsulfanylthiocarbonyl)sulfanyl]pentanoic acid, cyanomethyldodecyltrithiocarbonate, etc.; aromatic dithioesters, such as 2-cyano-2-propylbenzodithioate, 2-phenyl-2-propylbenzodithioate, etc.; and the like. Among those, bis (thiocarbonyl) disulfides, such as bis(thiobenzoyl) disulfide, bis(dodecylsulfanylthiocarbonyl) disulfide, etc., are preferred.

As a method of preparing the block copolymer by adopting the living radical polymerization method, there is exemplified a method in which the alkyl (meth)acrylate (A1) or the alkyl (meth)acrylate (A1) and the other monomer (A2) are first polymerized to prepare the acrylic polymer block (A), and the functional group-containing monomer (B1) or the functional group-containing monomer (B1) and the other monomer (B2) are then polymerized at the both ends of the polymer block (A), thereby binding the polymer block (B).

Furthermore, as another method, there is also exemplified a method in which after the component (B1) or the component (B1) and the component (B2) are polymerized to prepare the polymer block (B), the component (A) or the components (A1) and (A2) are polymerized on the polymer block (B) to bind the acrylic polymer block (A), and further, the component (B1) or the component (B1) and the component (B2) are again polymerized on the block (A), thereby binding the polymer block (B).

(Unsaturated Group-Containing Compound (C))

To the reactive functional group of the polymer block (B), the unsaturated group-containing compound (C) is bound. The unsaturated group-containing compound (C) means a compound having a functional group which reacts with the reactive functional group and an unsaturated group. Examples of the unsaturated group include groups having a carbon-carbon double bond, such as a (meth)acryloyl group, a vinyl group, an allyl group, etc. Among those, a (meth)acryloyl group is preferred. In addition, examples of the functional group which reacts with the reactive functional group include an isocyanate group, an epoxy group, and a carboxy group. Among those, an isocyanate group is preferred.

That is, as the unsaturated group-containing compound (C), a compound having an isocyanate group and a (meth)acryloyl group is preferred.

Specific examples of the unsaturated group-containing compound (C) include (meth)acryloyloxyethyl isocyanate, (meth)acryloyloxypropyl isocyanate, glycidyl (meth)acrylate, and the like. Among those, (meth)acryloyloxyethyl isocyanate and (meth)acryloyloxypropyl isocyanate are preferred.

In the acrylic polymer (β), it is preferred that 55 to 95 mol % of the reactive functional group of the block (B) reacts with the unsaturated group-containing compound (C). When 95 mol % or less of the reactive functional group of the block (B) reacts with the unsaturated group-containing compound (C), the reactive functional group in a certain amount remains without being reacted, so that it is possible to make crosslinking points on the occasion of being crosslinked with the crosslinking agent (D) relatively large. In addition, when 55 mol % or more of the reactive functional group of the block (B) reacts, it becomes possible to introduce a sufficient amount of the unsaturated group into the acrylic polymer (β). Accordingly, the energy ray curability of the pressure sensitive adhesive layer is made favorable, whereby it is easy to regulate the stress at rupture and the elongation at rupture to appropriate values.

From these viewpoints, it is more preferred that 60 to 90 mol % of the reactive functional group reacts with the unsaturated group-containing compound (C), and it is still more preferred that 65 to 85 mol % of the reactive functional group reacts with the unsaturated group-containing compound (C).

The unsaturated group-containing compound (C) does not react with the block (A), so that it is not introduced into side chains of the block (A). This is because the block (A) does not have the reactive functional group.

A weight average molecular weight (Mw) of the acrylic polymer constituting the pressure sensitive adhesive is regulated to preferably 50,000 to 1,500,000, more preferably 100,000 to 1,000,000, still more preferably 150,000 to 900,000, and yet still more preferably 400,000 to 900,000. When the weight average molecular weight of the acrylic polymer is regulated to 50,000 or more, the cohesion is enhanced, and furthermore, a network structure is readily formed by a polymer having a relatively long chain, whereby the adhesive residue on a workpiece, such as a semiconductor wafer, etc., or a stain-like residue as described later may be inhibited. In addition, when the weight average molecular weight of the acrylic polymer is regulated to 1,500,000 or less, a stable coating film of the pressure sensitive adhesive layer is obtained. In addition, by allowing the weight average molecular weight of the acrylic polymer to fall within the aforementioned range, appropriate pressure sensitive adhesion may be imparted to the pressure sensitive adhesive layer while enhancing the cohesion, and the removability may be made favorable. Furthermore, by regulating the weight average molecular weight to 400,000 or more, it becomes easy to make the stress at rupture favorable.

A molecular weight distribution (Mw/Mn) of the acrylic polymer constituting the pressure sensitive adhesive is preferably 3.0 or less. The residue remaining on the semiconductor wafer includes, in addition to the aforementioned adhesive residue on the bump portion, a residue called a stain-like residue. The stain-like residue is a residue in a stain form remaining in the surroundings of bumps, which is difficult to be confirmed through visual inspection and can be observed only by an electron microscope. In the present invention, by regulating the molecular weight distribution to 3.0 or less, it becomes possible to reduce such a stain-like residue.

In order to readily produce the acrylic polymer while inhibiting the stain-like residue, the molecular weight distribution of the acrylic polymer is more preferably 1.1 to 3.0, and still more preferably 1.4 to 2.5. By producing the acrylic polymer by the living radical polymerization as described above, it becomes possible to make the molecular weight distribution small. The molecular weight distribution is a value obtained according to ((weight average molecular weight (Mw))/(number molecular weight (Mn))).

[Crosslinking Agent (D)]

It is preferred that the pressure sensitive adhesive further contains a crosslinking agent (D) in addition to the acrylic polymer. When the acrylic polymer is crosslinked with the crosslinking agent (D), it becomes easy to regulate the stress at rupture and the elongation at rupture to appropriate values. Examples of the crosslinking agent (D) include an organic polyvalent isocyanate compound, an organic polyvalent epoxy compound, an organic polyvalent imine compound, a metal chelate-based crosslinking agent, and the like. Among those, an organic polyvalent isocyanate compound is preferred from the standpoint of its high reactivity.

Examples of the organic polyvalent isocyanate compound may include an aromatic polyvalent isocyanate compound, an aliphatic polyvalent isocyanate compound, and an alicyclic polyvalent isocyanate compound; a trimer, an isocyanurate, or an adduct of such an organic polyvalent isocyanate compound; an isocyanate-terminated urethane prepolymer obtained by allowing an organic polyvalent isocyanate compound and a polyol compound to react with each other; and the like.

Specific examples of the organic polyvalent isocyanate compound include 2,4-tolylene diisocyanate, 2,6-tolylene diisocyanate, 1,3-xylylene diisocyanate, 1,4-xylene diisocyanate, diphenylmethane-4,4'-diisocyanate, diphenylmethane-2,4'-diisocyanate, 3-methyldiphenylmethane diisocyanate, hexamethylene diisocyanate, isophorone diisocyanate, dicyclohexylmethane-4,4'-diisocyanate, dicyclohexylmethane-2,4'-diisocyanate, and lysine isocyanate; the above-exemplified derivatives obtained from these compounds; and the like.

Specific examples of the adduct include adducts with a low-molecular weight active hydrogen-containing compound, such as ethylene glycol, propylene glycol, neopentyl glycol, trimethylolpropane, castor oil, etc.; and for example, trimethylolpropane adduct xylylene diisocyanate, trimethylolpropane adduct tolylene diisocyanate, etc. are exemplified.

Specific examples of the organic polyvalent epoxy compound include 1,3-bis(N,N'-diglycidylaminomethyl)cyclohexane, N,N,N',N'-tetraglycidyl-m-xylylenediamine, ethylene glycol diglycidyl ether, 1,6-hexanediol diglycidyl ether, trimethylolpropane diglycidyl ether, diglycidylaniline, diglycidylamine, and the like.

Specific examples of the organic polyvalent imine compound include N,N'-diphenylmethane-4,4'-bis(1-aziridinecarboxyamide), trimethylolpropane-tri-β-aziridinyl propionate, tetramethylolmethane-tri-β-aziridinyl propionate, N,N'-toluene-2,4-bis(1-aziridinecarboxyamide)triethylenemelamine, and the like.

Specific examples of the metal chelate-based crosslinking agent include zirconium chelate-based crosslinking agents, such as zirconium tri-n-butoxyethyl acetoacetate, zirconium di-n-butoxybis(ethylacetoacetate), zirconium n-butoxytris(ethylacetoacetate), zirconium tetrakis(n-propylacetoacetate), zirconium tetrakis(acetylacetoacetate), zirconium tetrakis(ethylacetoacetate), etc.; titanium chelate-based crosslinking agents, such as titanium diisopropoxy-bis(ethylacetoacetate), titanium diisopropoxy-bis(acetylacetate), titanium diisopropoxy-bis(acetylacetone), etc.; aluminum chelate-based crosslinking agents, such as aluminum diisopropoxyethylacetoacetate, aluminum diisopropoxyacetylacetonate, aluminum isopropoxybis(ethylacetoacetate), aluminum isopropoxybis(acetylacetonate), aluminum tris(ethylacetoacetate), aluminum tris(acetylacetonate), aluminum monoacetylacetonate-bis(ethylacetoacetate), etc.; and the like.

As for the crosslinking agent (D), the above-enumerated crosslinking agents may be used either alone or in combination of two or more thereof. In the pressure sensitive adhesive, by properly regulating the amount of the crosslinking agent (D), the pressure sensitive adhesion performance, the stress at rupture, and the elongation at rupture may be regulated. The crosslinking agent (D) is blended in an amount of preferably 0.1 to 20 parts by mass, more preferably 0.2 to 15 parts by mass, and still more preferably 1 to 5 parts by mass based on 100 parts by mass of the acrylic polymer.

[Photopolymerization Initiator (E)]

It is preferred that the pressure sensitive adhesive contains a photopolymerization initiator (E). When the photopolymerization initiator (E) is contained, it becomes easy to advance the energy ray curing of the pressure sensitive adhesive layer with an ultraviolet ray or the like. Examples of the photopolymerization initiator (E) include low-molecular weight polymerization initiators, such as acetophenone, 2,2-diethoxybenzophenone, 4-methylbenzophenone, 2,4,6-trimethylbenzophenone, Michler's ketone, benzoin, benzoin methyl ether, benzoin ethyl ether, benzoin isopropyl ether, benzoin isobutyl ether, benzyldiphenyl sulfide, tetramethylthiuram monosulfide, benzyl dimethyl ketal, dibenzyl, diacetyl, 1-chloroanthraquinone, 2-chloroanthraquinone, 2-ethylanthraquinone, 2,2-dimethoxy-1,2-diphenylethan-1-one, 1-hydroxycyclohexyl phenyl ketone, 2-methyl-1-[4-(methylthio)phenyl]-2-morpholinopropanone-1,2-benzyl-2-dimethyl amino-1-(4-morpholinophenyl)-butanone-1,2-hydroxy-2-methyl-1-phenyl-1-propa none, diethyl thioxanthone, isopropyl thioxanthone, 2,4,6-trimethylbenzyldiphenyl-phosphine oxide, etc.; oligomerized polymerization initiators, such as oligo{2-hydroxy-2-methyl-1-[4-(1-methylvinyl)phenyl]propanone}, etc.; and the like. These may also be used in combination of two or more thereof.

The photopolymerization initiator (E) is contained in an amount of preferably about 0.01 to 15 parts by mass, and more preferably 0.5 to 12 parts by mass based on 100 parts by mass of the acrylic polymer.

The pressure sensitive adhesive may contain, in addition to the aforementioned components, a dye, a pigment, a degradation inhibitor, an antistatic agent, a flame retardant, a silicone compound, a chain transfer agent, a plasticizer, a filler, and so on.

Though the thickness of the pressure sensitive adhesive layer may be properly regulated according to, for example, a bump height of the semiconductor wafer surface, it is preferably 0.5 to 100 μm, more preferably 1 to 50 μm, and still more preferably 5 to 30 μm.

<Unevenness-Absorbing Layer>

In the present invention, an unevenness-absorbing layer is provided between the pressure sensitive adhesive layer and the base. In the present invention, when the unevenness-absorbing layer is provided, the unevenness absorptivity of the sheet for semiconductor processing is made favorable, whereby the pressure sensitive adhesive layer is readily adhered to a workpiece, such as a semiconductor wafer, etc. By making the adhesion favorable, between the uneven portion of the wafer and the pressure sensitive adhesive layer, the clearance becomes small, or the clearance disappears. Therefore, in the pressure sensitive adhesive layer, even a portion coming into contact with the uneven portion is hard to come into contact with air, and the energy ray curing becomes hard to be hindered by oxygen in air. According to this, after energy ray irradiation of the pressure sensitive adhesive layer, curing insufficiency of the pressure sensitive adhesive layer at a position coming into contact with the uneven portion hardly occurs. Therefore, in cooperation with enhancements of the stress at rupture and the elongation at rupture of the pressure sensitive adhesive layer, it becomes easy to prevent the adhesive residue from occurring.

In the unevenness-absorbing layer, its storage elastic modulus at 60° C. is preferably 0.001 to 1.0 MPa, and more preferably 0.001 to 0.5 MPa. In general, though the sheet for semiconductor processing is stuck in a heated state to the semiconductor wafer, by allowing the storage elastic modulus at 60° C. to fall within the aforementioned range, it is possible to enhance the adhesion on sticking the sheet for semiconductor processing to a workpiece, such as a semiconductor wafer, etc. In consequence, curing of the pressure sensitive adhesive layer in a portion coming into the uneven portion may be more appropriately performed, and therefore, the adhesive residue is readily much more prevented from occurring.

In the unevenness-absorbing layer, its storage elastic modulus at 25° C. is preferably 4.0 to 70 MPa, and more preferably 4.5 to 65 MPa. By allowing the storage elastic modulus at 25° C. to fall within the aforementioned range, after sticking, the shape of the unevenness-absorbing layer is held, and it becomes easy to keep the adhesion to the semiconductor wafer after sticking. In addition, by making the storage elastic modulus at the time of normal temperature relatively high as described above, effluence of the substances constituting the unevenness-absorbing layer from the edge portions of the sheet of semiconductor processing is prevented from occurring.

The storage elastic moduli of the aforementioned pressure sensitive adhesive layer and unevenness-absorbing layer are a storage elastic modulus when measured by giving a strain at a frequency of 1 Hz to a produced sample.

The unevenness-absorbing layer is preferably one resulting from subjecting a thin film containing a urethane (meth)acrylate (X) to polymerization curing through energy ray irradiation. In addition, more specifically, as the unevenness-absorbing layer, there is exemplified one formed by curing a composition containing a urethane (meth)acrylate (X), a polymerizable monomer (Y) composed of a (meth)acrylate (Y1) having an alicyclic structure and other polymerizable monomer (Y2) which is used in combination, if desired, and a thiol group-containing compound (Z) which is used in combination, if desired (the composition will be hereunder also referred to as "film-forming composition") through energy ray irradiation.

[Urethane (Meth)acrylate (X)]

The urethane (meth)acrylate (X) is a compound having at least a (meth)acryloyl group and a urethane bond and having such properties that it is polymerized and cured through energy ray irradiation.

Though the (meth)acryloyl group number in the urethane (meth)acrylate (hereinafter also referred to as "functional group number") may be monofunctional, bifunctional, or trifunctional or higher functional, it is preferred that a monofunctional urethane (meth)acrylate is contained. As for the monofunctional urethane (meth)acrylate, a three-dimensional network structure is hardly formed in the polymeric structure, and the storage elastic modulus is readily allowed to fall within the aforementioned range, whereby the unevenness absorptivity is readily enhanced.

The urethane (meth)acrylate may be, for example, obtained by allowing a (meth)acrylate having a hydroxy group to react with an isocyanate-terminated urethane prepolymer obtained through a reaction between a polyol compound and a polyvalent isocyanate compound.

The urethane (meth)acrylate may be used either alone or in combination of two or more thereof.

(Polyol Compound)

The polyol compound is not particularly limited so long as it is a compound having two or more hydroxy groups.

Specifically, examples of the polyol compound include an alkylene diol, a polyether type polyol, a polyester type polyol, a polycarbonate type polyol, and the like.

Among those, a polyether type polyol is preferred.

Though the polyol compound may be any of a bifunctional diol, a trivalent triol, and a tetrafunctional or higher functional polyol, a bifunctional diol is preferred, and a polyether type diol is more preferred.

The polyether type diol is preferably a compound represented by the following formula (2).

(2)

In the foregoing formula (2), though R is a divalent hydrocarbon group, it is preferably an alkylene group, and more preferably an alkylene group having 1 to 6 carbon atoms. Among alkylene groups having 1 to 6 carbon atoms, an ethylene group, a propylene group, and a tetramethylene group are preferred, and a propylene group and a tetramethylene group are more preferred.

n is a repeating unit number of the alkylene oxide and is 10 to 250, preferably 25 to 205, and more preferably 40 to 185. When n falls within the aforementioned range, the urethane bond concentration of the urethane (meth)acrylate to be obtained is made appropriate, whereby the unevenness absorptivity of the unevenness-absorbing layer is readily enhanced.

Among the compounds represented by the foregoing formula (2), polyethylene glycol, polypropylene glycol, and polytetramethylene glycol are preferred, and polypropylene glycol and polytetramethylene glycol are more preferred.

The isocyanate-terminated urethane prepolymer having an ether linkage (-(—R—O—)$_n$-) introduced thereinto is formed through a reaction between the polyether type diol and the polyvalent isocyanate compound. By using such a polyether type diol, the urethane (meth)acrylate contains a constitutional unit derived from the polyether type diol.

The polyester type polyol is obtained through polycondensation of a polyol component and a polybasic acid component. Examples of the polyol component include a variety of known glycols, such as ethylene glycol, diethylene glycol, triethylene glycol, 1,2-propanediol, 1,3-propanediol, 1,3-butanediol, 1,4-butanediol, neopentyl glycol, pentanediol, 3-methyl-1,5-pentanediol, 2,2,4-trimethyl-1,3-pentanediol, hexanediol, octanediol, 2,2-diethyl-1,3-propanediol, 2-ethyl-2-butyl-1,3-propanediol, 1,4-cyclohexanedimethanol, an ethylene glycol or propylene glycol adduct of bisphenol A, etc.; and the like.

As the polybasic acid component which is used for production of the polyester type polyol, a compound which is generally known as a polybasic acid component of polyester may be used. Specifically, examples of the polybasic acid component include aliphatic dibasic acids, such as adipic acid, maleic acid, succinic acid, oxalic acid, fumaric acid, malonic acid, glutaric acid, pimelic acid, azelaic acid, sebacic acid, suberic acid, etc.; aromatic polybasic acids, such as dibasic acids, e.g., phthalic acid, isophthalic acid, terephthalic acid, 2,6-naphthalenedicarboxylic acid, etc., polybasic acids, e.g., trimellitic acid, pyromellitic acid, etc., etc.; anhydrides corresponding to these compounds and derivatives thereof; and dimer acids, hydrogenated dimer acids, and the like. Among those, aromatic polybasic acids are preferred from the viewpoint of forming a coating film having an appropriate hardness are preferred.

(Polyvalent Isocyanate Compound)

Examples of the polyvalent isocyanate compound include aliphatic polyisocyanates, such as tetramethylene diisocyanate, hexamethylene diisocyanate, trimethylhexamethylene diisocyanate, etc.; alicyclic diisocyanates, such as isophorone diisocyanate, norbornane diisocyanate, dicyclohexylmethane-4,4'-diisocyanate, dicyclohexylmethane-2,4'-diisocyanate, ω,ω'-diisocyanate dimethylcyclohexane, etc.; aromatic diisocyanates, such as 4,4'-diphenylmethane diisocyanate, tolylene diisocyanate, xylylene diisocyanate, tolidine diisocyanate, tetramethylene xylylene diisocyanate, naphthalene-1,5-diisocyanate, etc.; and the like.

Among those, isophorone diisocyanate, hexamethylene diisocyanate, and xylylene diisocyanate are preferred from the viewpoint of handling properties.

((Meth)Acrylate Having a Hydroxy Group)

The urethane (meth)acrylate may be obtained by allowing a (meth)acrylate having a hydroxy group to react with an isocyanate-terminated urethane prepolymer obtained through a reaction between the aforementioned polyol compound and polyvalent isocyanate compound.

The (meth)acrylate having a hydroxy group is not particularly limited so long as it is a compound having at least a hydroxy group and a (meth)acryloyl group in one molecule.

Specifically, examples of the (meth)acrylate having a hydroxy group include hydroxyalkyl (meth)acrylates, such as 2-hydroxyethyl (meth)acrylate, 2-hydroxypropyl (meth)acrylate, 4-hydroxybutyl (meth) acrylate, 4-hydroxycyclohexyl (meth)acrylate, 5-hydroxycyclooctyl (meth)acrylate, 2-hydroxy-3-phenyloxypropyl (meth)acrylate, pentaerythritol tri(meth)acrylate, polyethylene glycol mono(meth)acrylate, polypropylene glycol mono(meth)acrylate, etc.; hydroxy group-containing (meth)acrylamides, such as N-methylol (meth)acrylamide, etc.; reaction products obtained by allowing a diglycidyl ester of vinyl alcohol, vinylphenol, or bisphenol A to react with (meth)acrylic acid; and the like.

Among those, hydroxyalkyl (meth)acrylates are preferred, and 2-hydroxyethyl (meth)acrylate is more preferred.

The urethane (meth)acrylate may be any of an oligomer and a polymer each having a repeating structure in the molecule, and a mixture thereof.

A weight average molecular weight of the urethane (meth) acrylate is preferably 1,000 to 100,000, more preferably 3,000 to 80,000, and still more preferably 5,000 to 65,000. When the weight average molecular weight is 1,000 or more, in a polymer of the urethane (meth)acrylate (X) and the polymerizable monomer (Y), an appropriate hardness is imparted to the unevenness-absorbing layer owing to an intermolecular force between the structures derived from the urethane (meth)acrylate (X), and hence, such is preferred.

The content of the component (X) in the film-forming composition (namely, a total amount of (X) to (Z) and other additive(s)) is preferably 20 to 70% by mass, more preferably 25 to 60% by mass, and still more preferably 30 to 50% by mass.

[Polymerizable Monomer (Y)]

From the viewpoint of improving film formability, the film-forming composition for forming the unevenness-absorbing layer contains, as the component (Y), a polymerizable monomer other than the component (X).

In the present invention, the polymerizable monomer to be used as the component (Y) is a polymerizable compound other than the urethane (meth)acrylate that is the component (X) and is a compound which is polymerizable with other components upon irradiation with an energy ray, and excludes a resin component having a weight average molecular weight of 1,000 or more.

In the present invention, the "resin component" refers to an oligomer or a polymer each having a repeating structure in the molecule and means a compound having a weight molecular weight of 1,000 or more.

The molecular weight (formula weight) of the polymerizable monomer to be used as the component (Y) is preferably 70 to 900, more preferably 80 to 700, still more preferably 90 to 500, and yet still more preferably 100 to 400.

((Meth)Acrylate (Y1) Having an Alicyclic Structure)

The film-forming composition for forming the unevenness-absorbing layer contains, as the aforementioned polymerizable monomer (Y), a (meth)acrylate (Y1) having an alicyclic structure. In the present invention, by using the (meth)acrylate having an alicyclic structure, it becomes possible to improve the film formability of the unevenness-absorbing layer. In addition, in a cured product obtained, there is a tendency that the three-dimensional network structure expands by steric hindrance of the side chains to be caused due to the (meth)acrylate having an alicyclic structure. Therefore, the storage elastic modulus becomes easy to fall within the aforementioned range, and the unevenness absorptivity becomes readily favorable.

Specifically, examples of the (meth)acrylate having an alicyclic structure include isobornyl (meth)acrylate, dicyclopentenyl (meth)acrylate, dicyclopentanyl (meth)acrylate, dicyclopentenyloxy (meth)acrylate, cyclohexyl (meth)acrylate, adamantane (meth)acrylate, and the like. Among those, isobornyl (meth)acrylate is preferred in view of the matter that the storage elastic modulus becomes easy to fall within the aforementioned range.

In order to make the storage elastic modulus easy to fall within the aforementioned range, the content of the (meth) acrylate (Y1) having an alicyclic structure in the film-forming composition is preferably 32 to 53% by mass, more preferably 35 to 51% by mass, and still more preferably 37 to 48% by mass.

(Other Polymerizable Monomer (Y2))

The film-forming composition for forming the unevenness-absorbing layer may contain, as the aforementioned polymerizable monomer (Y), a polymerizable monomer other than the (meth)acrylate (Y1) having an alicyclic structure (such a polymerizable monomer is also referred to as "other polymerizable monomer (Y2)).

The other polymerizable monomer (Y2) is preferably a compound having at least one (meth)acryloyl group.

Examples of the other polymerizable monomer (Y2) include a (meth)acrylate having an alkyl group having 1 to 30 carbon atoms; a (meth)acrylate having a functional group, such as a hydroxy group, an amino group, an epoxy group, etc.; an amide group-containing compound; a (meth) acrylate having an aromatic structure; a (meth)acrylate having a heterocyclic structure; a vinyl compound, such as styrene, hydroxyethyl vinyl ether, hydroxybutyl vinyl ether, N-vinylformamide, N-vinylpyrrolidone, N-vinylcaprolactam, etc.; and the like. Among those, a (meth)acrylate having a functional group is preferred.

Examples of the (meth)acrylate having an alkyl group having 1 to 30 carbon atoms include methyl (meth)acrylate, ethyl (meth)acrylate, n-propyl (meth) acrylate, isopropyl (meth) acrylate, n-butyl (meth) acrylate, isobutyl (meth) acrylate, t-butyl (meth)acrylate, n-pentyl (meth) acrylate, n-hexyl (meth) acrylate, 2-ethylhexyl (meth)acrylate, n-octyl (meth) acrylate, nonyl (meth) acrylate, n-decyl (meth) acrylate, lauryl (meth) acrylate, myristyl (meth) acrylate, palmityl (meth) acrylate, stearyl (meth) acrylate, eicosyl (meth)acrylate, and the like.

Examples of the (meth)acrylate having a functional group include hydroxy group-containing (meth)acrylates, such as 2-hydroxyethyl (meth)acrylate, 2-hydroxypropyl (meth) acrylate, 3-hydroxypropyl (meth)acrylate, 2-hydroxybutyl (meth)acrylate, 3-hydroxybutyl (meth)acrylate, 4-hydroxybutyl (meth)acrylate, etc.; amino group-containing (meth) acrylates, such as a primary amino group-containing (meth) acrylate, a secondary amino group-containing (meth)acrylate, a tertiary amino group-containing (meth)acrylate, etc.; epoxy group-containing (meth)acrylates, such as glycidyl (meth)acrylate, methylglycidyl (meth)acrylate, etc.; and the like. Among those, hydroxy group-containing (meth)acrylates are preferred.

Examples of the amide group-containing compound include (meth)acrylamide compounds, such as (meth)acrylamide, N,N-dimethyl (meth)acrylamide, N-butyl (meth) acrylamide, N-methylol (meth)acrylamide, N-methylolpropane (meth)acrylamide, N-methoxymethyl (meth) acrylamide, N-butoxymethyl (meth)acrylamide, etc.

Examples of the (meth)acrylate having an aromatic structure include phenylhydroxypropyl (meth) acrylate, benzyl (meth)acrylate, 2-hydroxy-3-phenoxypropyl (meth)acrylate, and the like.

Examples of the (meth)acrylate having a heterocyclic structure include tetrahydrofurfuryl (meth)acrylate, morpholine acrylate, and the like.

The content of the (meth)acrylate (Y1) having an alicyclic structure relative to the total amount of the component (Y)

which is contained in the film-forming composition is preferably 52 to 87% by mass, more preferably 55 to 85% by mass, and still more preferably 60 to 80% by mass.

The content of the component (Y) in the film-forming composition is preferably 30 to 80% by mass, more preferably 40 to 75% by mass, and still more preferably 50 to 70% by mass.

Furthermore, a mass ratio of the component (X) to the component (Y) in the film-forming composition [(component (X))/(component (Y))] is preferably 20/80 to 60/40, more preferably 30/70 to 50/50, and still more preferably 35/65 to 45/55.

[Thiol Group-Containing Compound (Z)]

The film-forming composition for forming the unevenness-absorbing layer contains, as the component (Z), a thiol group-containing compound. When the film-forming composition contains the thiol group-containing compound (Z) serving as a chain transfer agent together with the (meth) acrylate (Y1) having an alicyclic structure, in a cured product, the length of a continuous structure of the polymerizable functional group becomes short, and the three-dimensional network structure does not become excessively large, and therefore, flowability at the time of high temperature may be exhibited. According to this, in the unevenness-absorbing layer, it becomes easy to regulate the storage elastic moduli at 25° C. and 60° C. as described above to the aforementioned ranges. In consequence, when the sheet for semiconductor processing is stuck to a semiconductor wafer at a high temperature, it is possible to improve the unevenness absorptivity, to prevent the generation of a gap between the uneven portion, such as a bump, etc., and the sheet for semiconductor processing from occurring, and to enhance the adhesion to a workpiece, such as a semiconductor wafer, etc.

Though the thiol group-containing compound is not particularly limited so long as it is a compound having at least one thiol group in the molecule, from the aforementioned viewpoint, it is preferably a polyfunctional thiol group-containing compound, and more preferably a tetrafunctional thiol group-containing compound.

Specifically, examples of the thiol group-containing compound include nonyl mercaptan, 1-dodecanethiol, 1,2-ethanedithiol, 1,3-propanedithiol, triazinethiol, triazinedithiol, triazinetrithiol, 1,2,3-propanetrithiol, tetraethylene glycol-bis(3-mercaptopropionate), trimethylolpropane tris(3-mercaptopropionate), pentaerythritol tetrakis(3-mercaptopropionate), pentaerythritol tetrakisthioglycolate, dipentaerythritol hexakis(3-mercaptopropionate), tris [(3-mercaptopropionyloxy)-ethyl]-isocyanurate, 1,4-bis(3-mercaptobutyryloxy)butane, pentaerythritol tetrakis(3-mercaptobutyrate), 1,3,5-tris(3-mercaptobutyloxyethyl)-1,3,5-triazine-2,4,6-(1H,3H,5H)-trione, and the like. Among those, pentaerythritol tetrakis(3-mercaptobutyrate) is preferred.

These thiol group-containing compounds may be used either alone or in combination of two or more thereof.

The molecular weight (formula weight) of the thiol group-containing compound is preferably 200 to 3,000, and more preferably 300 to 2,000. When the foregoing molecular weight falls within the aforementioned range, compatibility with the component (X) becomes favorable, whereby the film formability may be made favorable.

The content of the component (Z) is preferably 0.5 to 5.0 parts by mass, and more preferably 0.75 to 4.0 parts by mass based on 100 parts by mass of a sum total of the component (X) and the component (Y). By allowing the content of the component (Z) to fall within the aforementioned range, it becomes easy to form the unevenness-absorbing layer having a high elastic modulus at the time of normal temperature and high flowability at the time of high temperature.

It is preferred that the film-forming composition further contains a photopolymerization initiator. When the photopolymerization initiator is contained, it becomes easy to cure a thin film made of the film-forming composition with an energy ray, such as an ultraviolet ray, etc.

Examples of the photopolymerization initiator include photopolymerization initiators, such as a benzoin compound, an acetophenone compound, an acyl phosphinoxide compound, a titanocene compound, a thioxanthone compound, a peroxide compound, etc.; photosensitizers, such as an amine, a quinone, etc.; and the like. More specifically, examples thereof include 1-hydroxycyclohexyl phenyl ketone, 2-hydroxy-2-methyl-1-phenyl-propan-1-one, benzoin, benzoin methyl ether, benzoin ethyl ether, benzoin isopropyl ether, and the like.

These photopolymerization initiators may be used either alone or in combination of two or more thereof.

The content of the photopolymerization initiator is preferably 0.05 to 15 parts by mass, more preferably 0.1 to 10 parts by mass, and still more preferably 0.3 to 5 parts by mass based on 100 parts by mass of a sum total of the aforementioned components (X) to (Z).

The film-forming composition may contain other additive within a range where the effects of the present invention are not impaired. Examples of the other additive include a crosslinking agent, an antioxidant, a softener (plasticizer), a filler, a rust preventing agent, a pigment, a dye, and the like.

It is preferred that the thickness of the unevenness-absorbing layer 12 is properly regulated according to the height of a bump, etc. objective to protection, and a specific numerical value range thereof is preferably 100 to 800 μm, and more preferably 200 to 500 μm. When the thickness of the unevenness-absorbing layer is 100 μm or more, a material having a usual bump height may be appropriately protected, and when it is 200 μm or more, even a material having a high bump height may be appropriately protected. In addition, when the foregoing thickness is 800 μm or less, a strain generated when the sheet for semiconductor processing bents may be reduced.

<Base>

Though the base is not particularly limited, it is preferably a resin film. The resin film is suitable for a processing member of electronic parts because it produces a less amount of dusts as compared with paper or nonwoven fabric, and it is easily available.

The base may be a single-layer film formed of a single resin film, or may be a multilayer film formed by laminating a plurality of resin films.

Examples of the resin film which is used as the base include a polyolefin-based film, a vinyl halide polymer-based film, an acrylic resin-based film, a rubber-based film, a cellulose-based film, a polyester-based film, a polycarbonate-based film, a polystyrene-based film, a polyphenylene sulfide-based film, a cycloolefin polymer-based film, a film formed of a cured product of an energy ray-curable composition containing a urethane resin, a film formed of an ionomer, and the like.

Among those, from the viewpoints that the stiffness is relatively high; the pressure sensitive adhesive layer or workpiece may be stably held; and so on, a resin film selected from a polyester-based film, a polycarbonate-based film, a polystyrene-based film, a polyphenylene sulfide-based film, and a cycloolefin polymer-based film is preferred, and a polyester-based film is more preferred.

Specifically, examples of the polyester-based film include films made of a polyester, such as polyethylene terephthalate, polyethylene isophthalate, polybutylene terephthalate, polyethylene-2,6-naphthalenedicarboxylate, etc.

The polyester-based film may also be a resin mixed film composed of a mixture of the aforementioned polyester and a relatively small amount of other resin.

Among those polyester-based films, from the viewpoints of easiness of availability and high thickness precision, a polyethylene terephthalate (PET) film is preferred. In addition, a multilayer film formed by laminating a polyester-based film, such as a PET film, etc., and a polyolefin-based film is also preferred.

From the viewpoint of imparting appropriate elasticity to the sheet for semiconductor processing, the thickness of the base is preferably 5 to 250 µm, more preferably 10 to 200 µm, and still more preferably 25 to 150 µm. It is desired that the thickness of the base is properly set along with the thicknesses of the pressure sensitive adhesive layer and the unevenness-absorbing layer depending upon the shape or height of the bump.

From the viewpoint of improving adhesiveness between the base and the unevenness-absorbing layer, a base formed by further laminating an easily adhesive layer on the surface of the resin film may be used. Furthermore, the base may also contain a filler, a coloring agent, an antistatic agent, an antioxidant, an organic lubricant, a catalyst, or the like within a range where the effects of the present invention are not impaired. The base may be either transparent or opaque. However, the base is preferably one capable of transmitting an energy ray to a sufficient degree of curing the pressure sensitive adhesive layer.

<Release Material>

As the release material which is used in the present invention, a release sheet in which both surfaces thereof are subjected to a release treatment, a release sheet in which one surface thereof is subjected to a release treatment, and so on are useful. Examples thereof include a base formed by applying a release agent on a base for release material.

Examples of the base for release material include plastic films, such as films formed of a polyester resin, e.g., a polyethylene terephthalate resin, a polybutylene terephthalate resin, a polyethylene naphthalate resin, etc.; films formed of a polyolefin resin, e.g., a polypropylene resin, a polyethylene resin, etc.; etc., and the like. Examples of the release agent include a rubber-based elastomer, such as a silicone-based resin, an olefin-based resin, an isoprene-based resin, a butadiene-based resin, etc.; a long-chain alkyl-based resin; an alkyd-based resin; a fluorine-based resin; and the like.

Though the thickness of the release material is not particularly limited, it is preferably 5 to 200 µm, more preferably 10 to 120 µm, and still more preferably 15 to 80 µm.

[Production Method of Sheet for Semiconductor Processing]

A production method of the sheet for semiconductor processing of the present invention is not particularly limited and is properly selected among known methods.

For example, the unevenness-absorbing layer may be formed by applying the film-forming composition directly on one surface of the base to form a coating film (thin film) and then performing a curing treatment, such as irradiation with an energy ray, etc. In addition, the coating film may be dried by heating, if desired.

The unevenness-absorbing layer may also be formed by applying the film-forming composition directly on the release-treated surface of the release material to form a coating film and then sticking the coating film to the base. On that occasion, the coating film may be cured prior to sticking to the base, or may be cured after sticking to the base. Furthermore, the coating film may be subjected to a semi-curing treatment before sticking to the base, stick to the base material, and then completely cure. The release material has only to be removed before the pressure sensitive adhesive layer is formed on the unevenness-absorbing layer.

The pressure sensitive adhesive layer may be, for example, formed by applying the pressure sensitive adhesive directly on the unevenness-absorbing layer formed as described above and heating for drying, if desired. In addition, the sheet for semiconductor sheet in which the unevenness-absorbing layer, the pressure sensitive adhesive layer, and the release material are provided in this order on the base may also be formed by applying a pressure sensitive adhesive on the release-treated surface of the release material and if desired, heating for drying to form the pressure sensitive adhesive layer on the release material, followed by sticking the pressure sensitive adhesive layer on the release material and the unevenness-absorbing layer to each other. Thereafter, the release material may be released, if desired.

On forming the unevenness-absorbing layer or the pressure sensitive adhesive layer, the aforementioned film-forming composition or pressure sensitive adhesive may be further diluted with an organic solvent and used. Examples of the organic solvent to be used include methyl ethyl ketone, acetone, ethyl acetate, tetrahydrofuran, dioxane, cyclohexane, n-hexane, toluene, xylene, n-propanol, isopropanol, and the like. As such an organic solvent, the organic solvent which has been used at the time of synthesizing each of the components to be contained in the film-forming composition or the pressure sensitive adhesive may be used as it is, or at least one other organic solvent may be added, too.

The film-forming composition or the pressure sensitive adhesive may be applied by a known application method. Examples of the application method include a spin coating method, a spray coating method, a bar coating method, a knife coating method, a roll coating method, a blade coating method, a die coating method, a gravure coating method, and the like. In addition, in the case where the film-forming composition or the pressure sensitive adhesive is one diluted with an organic solvent, after applying this, it is preferred to perform a drying treatment by heating at a temperature of 80 to 150° C. for 30 seconds to 5 minutes.

As the curing treatment after applying the film-forming composition, a method in which the formed coating film is polymerized and cured upon irradiation with an energy ray, such as an ultraviolet ray, etc., thereby achieving the film formation is preferred. In addition, as for the curing treatment, the coating film may be completely cured all at once, or may be cured dividedly plural times.

Examples of the energy ray include an electron beam, a laser beam, an α-ray, a β-ray, a γ-ray, and an X-ray, and an ultraviolet ray is preferred. In addition, the irradiation amount of the energy ray is properly changed depending upon the type of the energy ray. For example, in the case of using an ultraviolet ray, the illuminance of the ultraviolet ray to be irradiated is preferably 50 to 500 mW/cm$^2$, and more preferably 100 to 340 mW/cm$^2$, and the luminous amount of the ultraviolet ray is preferably 100 to 2,500 mJ/cm$^2$, and more preferably 150 to 2,000 J/cm$^2$.

[Use Method of Sheet for Semiconductor Processing]

The sheet for semiconductor processing of the present invention is one which on processing a semiconductor wafer, is stuck to the semiconductor wafer via the pressure sensitive adhesive layer and used. In the case where the release material is further provided on the pressure sensitive adhesive layer, after the release material is removed, the sheet for semiconductor processing is stuck to the semiconductor wafer. Though the temperature at which the sheet for semiconductor processing is stuck to the semiconductor wafer is not particularly limited, it is, for example, 40 to 90° C., and preferably 50 to 80° C.

The sheet for semiconductor processing is one which is stuck to an uneven surface of a workpiece, such as a semiconductor wafer, etc., and used, and preferably, it is stuck to the surface of the semiconductor wafer provided with plural bumps and used. In the sheet for semiconductor processing, the adhesive residue generated in the uneven portions or bumps by the aforementioned unevenness-absorbing layer and pressure sensitive adhesive layer may be appropriately prevented from occurring.

In the sheet for semiconductor processing of the present invention, the pressure sensitive adhesive layer is energy ray-curable, and therefore, before the sheet for semiconductor processing stuck to a workpiece, such as a semiconductor wafer, etc., is released from the workpiece, it is irradiated with an energy ray, whereby the pressure sensitive adhesive layer is cured. In the sheet for semiconductor processing, when the pressure sensitive adhesive layer is cured, the adhesive strength against the semiconductor wafer is lowered, whereby it is readily released from the semiconductor wafer. Examples of the energy ray include an ultraviolet ray, an electron beam, a laser beam, an α-ray, a β-ray, a γ-ray, and an X-ray, and from the viewpoints of easiness in control, versatility, and so on, it is preferred to use an ultraviolet ray.

It is preferred that the sheet for semiconductor processing of the present invention is stuck to the semiconductor wafer surface at the time of grinding the back surface of the semiconductor wafer and used as a back grinding sheet. When the sheet for semiconductor processing is used as the back grinding sheet, it is possible to appropriately protect the semiconductor wafer surface at the time of grinding the back surface while preventing the adhesive residue on the semiconductor wafer.

However, the sheet for semiconductor processing is also usable for an application other than the back grinding sheet, and on dicing the semiconductor wafer, the sheet for semiconductor processing may also be used as a dicing sheet which is stuck to a semiconductor wafer and used.

EXAMPLES

The present invention is hereunder described in more detail by reference to Examples, but it should be construed that the present invention is by no means limited by these Examples.

Specific measurement methods and evaluation methods in the present invention are as follows.

[Tensile Test]

Using a pressure sensitive adhesive, a pressure sensitive adhesive layer having a thickness of 50 µm, in which a PET-based release film (a product name: SP-PET381031, manufactured by Lintec Corporation, thickness: 38 µm) was stuck to both surfaces thereof, was formed by a knife coater. Plural sheets of the thus formed pressure sensitive adhesive layer were prepared, and an operation of releasing a one-sided PET-based release film and sticking the released pressure sensitive adhesive layer surfaces to each other was repeated to laminate four sheets, thereby producing a laminate of the pressure sensitive adhesive layers.

This laminate was cured upon irradiation with an ultraviolet ray by using a UV irradiation apparatus (a product name: RAD-2000m/12, manufactured by Lintec Corporation) at an irradiation rate of 15 mm/sec, an illuminance of 220 mW/cm$^2$, and a luminous amount of 500 mJ/cm$^2$.

In conformity with JIS K7127 (1999), the cured product was cut out in a size of 15 mm×140 mm, and 20-mm portions of both ends thereof were stuck with a film-pulling label, thereby producing a dumbbell-type sample of 15 mm×100 mm. This sample was drawn at a tension rate of 200 mm/min in an environment at 23° C. and a relative humidity of 50% by using an autograph AG-IS 500N, manufactured by Shimadzu Corporation, thereby measuring a stress at rupture and an elongation at rupture.

[Weight Average Molecular Weight (Mw) and Number Average Molecular Weight (Mn)]

The measurement was performed under the following conditions by using a gel permeation chromatograph (a product name: HLC-8020, manufactured by Tosoh Corporation), and measured values expressed in terms of standard polystyrene were used.

(Measurement Conditions)

Column: "TSK guard column HXL-H", "TSK gel GMHXL (×2)", and "TSK gel G2000HXL" (all are manufactured by Tosoh Corporation)

Column temperature: 40° C.

Developing solvent: Tetrahydrofuran

Flow rate: 1.0 mL/min

[Storage Elastic Modulus of Unevenness-Absorbing Layer]

A film-forming composition for forming an unevenness-absorbing layer was applied on a PET-based release film (a product name; SP-PET381031, manufactured by Lintec Corporation, thickness: 38 µm) in a fountain die system, thereby forming a coating film. An ultraviolet ray was irradiated from the coating film side, to form a semi-cured layer.

The ultraviolet ray irradiation was performed using a belt conveyer system ultraviolet ray irradiation apparatus as an ultraviolet ray irradiation apparatus and a high pressure mercury lamp as an ultraviolet ray source under the irradiation conditions of an illuminance of 112 mW/cm$^2$ at a light wavelength of 365 nm and a luminous amount of 177 mJ/cm$^2$.

On the formed semi-cured layer, a PET-based release film (a product name; SP-PET381031, manufactured by Lintec Corporation, thickness: 38 µm) was laminated, and the laminate was completely cured by further performing the irradiation with an ultraviolet ray (irradiation conditions of an illuminance of 271 mW/cm$^2$ and a luminous amount of 1,200 mJ/cm$^2$), thereby forming an unevenness-absorbing layer having a thickness of 200 µm, in which the release film was stuck on the both surfaces thereof.

Five of the thus formed unevenness-absorbing layer were prepared, and the PET-based release film was released and successively laminated to prepare an unevenness-absorbing layer laminate (thickness: 1,000 µm).

Subsequently, the obtained unevenness-absorbing layer laminate was punched out in a circle having a diameter of 8 mm, thereby preparing a sample for measuring viscoelasticity.

A strain at a frequency of 1 Hz was given to the aforementioned sample by a viscoelasticity measuring apparatus (a product name: ARES, manufactured by TA Instruments), and a storage elastic modulus (G') at −50 to 150° C. was measured at a temperature rise rate of 4° C./min, thereby determining values of storage elastic moduli at 25° C. and 60° C.

[Storage Elastic Modulus of Pressure Sensitive Adhesive Layer]

Using a pressure sensitive adhesive, a pressure sensitive adhesive layer having a thickness of 50 μm, in which a PET-based release film (a product name: SP-PET381031, manufactured by Lintec Corporation, thickness: 38 μm) was stuck to both surfaces thereof, was formed by a knife coater. Plural sheets of the thus formed pressure sensitive adhesive layer were prepared, and the PET-based release film was released and successively laminated to prepare a pressure sensitive adhesive layer laminate (thickness: 1,000 μm). Subsequently, the obtained pressure sensitive adhesive layer laminate was punched out in a circle having a diameter of 10 mm, thereby preparing a sample for measuring viscoelasticity.

A strain at a frequency of 1 Hz was given to the aforementioned sample by a viscoelasticity measuring apparatus (a product name: ARES, manufactured by TA Instruments), and a storage elastic modulus at −50 to 150° C. was measured at a temperature rise rate of 4° C./min, thereby determining values of storage elastic moduli at 23° C. and 60° C.

[Evaluation of Adhesive Crack and Adhesive Residue]

The sheet for semiconductor processing prepared in each of the Examples and Comparative Examples was stuck on a bump-provided wafer (8-inch wafer, manufactured by Waltz) having a bump diameter of 300 μm, a bump height of 250 μm, and a pitch of 500 μm by using a laminator RAD-3510F/12, manufactured by Lintec Corporation. On performing sticking, a laminate table and a laminate roll of the laminator were set to 60° C. After sticking, an ultraviolet ray was irradiated from the side of the sheet for semiconductor processing by using a UV irradiation apparatus RAD-2000m/12, manufactured by Lintec Corporation at an irradiation rate of 15 mm/sec, an illuminance of 230 W/cm$^2$, and a luminous amount of 500 mJ/cm$^2$. In an evaluation wafer in which the thus obtained sheet for semiconductor processing was stuck, the sheet for semiconductor processing was released at a release rate of 2 mm/sec in an environment at 23° C. by using a wafer mounter RAD-2700F/12, manufactured by Lintec Corporation.

After releasing, in the sheet for semiconductor processing, a portion having bumps embedded therein and a bump portion of a bump-provided wafer were observed at a magnification of 100 times by using an electron microscope VE-9800, manufactured by Keyence Corporation, thereby evaluating the rupture of the pressure sensitive adhesive of the sheet for semiconductor processing and the adhesive residue on the bump portion of the wafer according to the following evaluation criteria.

<Rupture of Pressure Sensitive Adhesive>
A: No
B: Cracks were observed.
C: The pressure sensitive adhesive fell.

<Adhesive Residue of Bump>
A: No
B: The adhesive residue was slightly observed.
C: The adhesive residue was significantly observed.

[Stain-Like Residue]

A release film (a product name; "SP-PET381031", manufactured by Lintec Corporation, thickness: 38 μm) which was cut in a size of 10 mm in square was placed on a silicon mirror wafer, and the sheet for semiconductor processing was then stuck on the same from above. The resultant was allowed to stand for 8 hours under shading conditions and then irradiated with an ultraviolet ray (230 mW/cm$^2$ and 380 mJ/cm$^2$) using a UV irradiation apparatus (a product name: "RAD2000M/12", manufactured by Lintec Corporation), followed by releasing the sheet for semiconductor processing.

Subsequently, the place at which the aforementioned release film had existed was observed with an electron microscope (a scanning electron microscope "VE-9800", manufactured by Keyence Corporation). The presence or absence of the stain-like residue was judged due to a difference in coloring between an unstuck portion and a stuck portion of the sheet for semiconductor processing.

The case where the stain-like residue was not observed was evaluated as "A", and the case where the stain-like residue was observed was evaluated as "C".

Example 1

(Production of Base-Provided Unevenness-Absorbing Layer)

40 parts by mass of monofunctional urethane acrylate, 45 parts by mass of isobornyl acrylate, 15 parts by mass of 2-hydroxypropyl acrylate, 3.5 parts by mass of pentaerythritol tetrakis(3-mercaptobutyrate) (a product name: KARENZ MT PE1, manufactured by Showa Denko K.K., which is a secondary tetrafunctional thiol group-containing compound), 1.8 parts by mass of a crosslinking agent, and 1.0 parts by mass of 2-hydroxy-2-methyl-1-phenyl-propan-1-one (a product name: DAROCUR 1173, manufactured by BASF SE) as a photopolymerization initiator were mixed to obtain a film-forming composition.

The film-forming composition was applied on a PET-based release film (a product name; "SP-PET381031", manufactured by Lintec Corporation, thickness: 38 μm) in a fountain die system such that the thickness after curing was 300 μm, thereby forming a coating film. An ultraviolet ray was then irradiated from the coating film side, to form a semi-cured layer. The ultraviolet ray irradiation was performed using a belt conveyer system ultraviolet ray irradiation apparatus as an ultraviolet ray irradiation apparatus and a high pressure mercury lamp as an ultraviolet ray source under the conditions of a light wavelength of 365 nm, an illuminance of 112 mW/cm$^2$, and a luminous amount of 177 mJ/cm$^2$.

A PET film (a product name: COSMOSHINE A4100, manufactured by Toyobo Co., Ltd., thickness: 50 μm) as a base was laminated on the formed semi-cured layer, and the laminate was completely cured by further performing the ultraviolet ray irradiation from the laminated PET film side by using the aforementioned ultraviolet ray irradiation apparatus and ultraviolet ray source under the conditions of an illuminance of 271 mW/cm$^2$ and a luminous amount of 1,200 mJ/cm$^2$, thereby obtaining an unevenness-absorbing layer-provided base in which the unevenness-absorbing layer was protected by the PET-based release film. The thickness of the unevenness-absorbing layer was 300 μm.

The storage elastic moduli of the unevenness-absorbing layer at 25° C. and 60° C. were 12.3 MPa and 0.0428 MPa, respectively.

(Formation of Pressure Sensitive Adhesive Layer)

An acrylic triblock copolymer in which both ends of a block (A) made of a polymer of n-butyl acrylate in an amount of 85% by mass on a basis of all of constitutional units of the acrylic triblock copolymer were bound with a block (B) made of a polymer of 2-hydroxyethyl acrylate in an amount of 7.5% by mass, respectively was prepared by living radical polymerization. 75 mol % of the hydroxy group as a constitutional unit derived from 2-hydroxyethyl acrylate of this acrylic triblock copolymer was bound with 2-methacryloyloxyethyl isocyanate, to obtain an acrylic polymer (Mw: 200,000, Mw/Mn: 1.50).

To 100 parts by mass of the acrylic polymer, 2.1 parts by mass of trimethylolpropane adduct tolylene diisocyanate (a product name: Coronate L, manufactured by Tosoh Corporation) as a crosslinking agent and 10.7 parts by mass of 2,2-dimethoxy-1,2-diphenylethan-1-one (a product name: Irgacure 651, manufactured by BASF SE) as a photopolymerization initiator were added (solid mass ratio), and the mixture was regulated with toluene in a solid content concentration of 20% by mass and stirred for 30 minutes, to obtain a diluted liquid of pressure sensitive adhesive.

This diluted liquid of pressure sensitive adhesive was applied on a PET-based release film (a product name; "SP-PET381031", manufactured by Lintec Corporation, thickness: 38 μm) and dried to form a pressure sensitive layer having a thickness of 10 μm. The storage elastic modulus of the pressure sensitive adhesive layer at 23° C. was $1.0 \times 10^5$ Pa.

Thereafter, the release film on the unevenness-absorbing layer-provided base as produced previously was removed, and the exposed unevenness-absorbing layer and the pressure sensitive adhesive layer were stuck to each other to obtain a sheet for semiconductor processing.

Example 2

An acrylic triblock copolymer in which both ends of a block (A) made of a random copolymer composed of n-butyl acrylate in an amount of 70% by mass and methyl acrylate in an amount of 15% by mass on a basis of all of constitutional units of the acrylic triblock copolymer were bound with a block (B) made of a polymer of 2-hydroxyethyl acrylate in an amount of 7.5% by mass, respectively was prepared by living radical polymerization. 75 mol % of the hydroxy group as a constitutional unit derived from 2-hydroxyethyl acrylate of this acrylic triblock copolymer was bound with 2-methacryloyloxyethyl isocyanate, to obtain an acrylic polymer (Mw: 200,000, Mw/Mn: 1.43). Thereafter, a sheet for semiconductor processing was produced in the same procedures as in Example 1. The storage elastic modulus of the pressure sensitive adhesive layer at 23° C. was $1.1 \times 10^5$ Pa.

Example 3

An acrylic triblock copolymer in which both ends of a block (A) made of a random polymer composed of n-butyl acrylate in an amount of 80% by mass and methyl methacrylate in an amount of 5% by mass on a basis of all of constitutional units of the acrylic triblock copolymer were bound with a block (B) made of a polymer of 2-hydroxyethyl acrylate in an amount of 7.5% by mass, respectively was prepared by living radical polymerization. 75 mol % of the hydroxy group as a constitutional unit derived from 2-hydroxyethyl acrylate of this acrylic triblock copolymer was bound with 2-methacryloyloxyethyl isocyanate, to obtain an acrylic polymer (Mw: 200,000, Mw/Mn: 1.46). Thereafter, a sheet for semiconductor processing was produced in the same procedures as in Example 1, except that the addition amount of the trimethylolpropane adduct tolylene diisocyanate was changed to 2.9 parts by mass. The storage elastic modulus of the pressure sensitive adhesive layer at 23° C. was $1.2 \times 10^5$ Pa.

Example 4

A sheet for semiconductor was produced in the same procedures as in Example 3, except that the weight average molecular weight of the acrylic polymer was regulated to 600,000. Mw/Mn of the acrylic polymer was 2.04. In addition, the storage elastic modulus of the pressure sensitive adhesive layer at 23° C. was $8.6 \times 10^4$ Pa.

Comparative Example 1

An acrylic random copolymer was obtained through random polymerization of 2-ethylhexyl acrylate in an amount of 90% by mass and 4-hydroxybutyl acrylate in an amount of 10% by mass on a basis of all of constitutional units of the acrylic random copolymer by free radical polymerization. In this acrylic random copolymer, 60 mol % of the hydroxy group as a constitutional unit derived from 4-hydroxybutyl acrylate was bound with 2-methacryloyloxyethyl isocyanate, to obtain an acrylic polymer (Mw: 1,300,000, Mw/Mn: 5.44). To 100 parts by mass of this acrylic polymer, 0.72 parts by mass of trimethylolpropane adduct tolylene diisocyanate (a product name: Coronate L, manufactured by Tosoh Corporation) as a crosslinking agent and 5.0 parts by mass of 2,2-dimethoxy-1,2-diphenylethan-1-one (a product name: Irgacure 651, manufactured by BASF SE) as a photopolymerization initiator were added, and the mixture was regulated with toluene in a solid content concentration of 20% by mass and stirred for 30 minutes, to obtain a diluted liquid of pressure sensitive adhesive. Thereafter, a sheet for semiconductor processing was produced in the same procedures as in Example 1. The storage elastic modulus of the pressure sensitive adhesive layer at 23° C. was $2.9 \times 10^4$ Pa.

Comparative Example 2

An acrylic triblock copolymer in which both ends of a block (A) made of a polymer of 2-ethylhexyl acrylate in an amount of 85% by mass on a basis of all of constitutional units of the acrylic triblock copolymer were bound with a block (B) made of a polymer of 4-hydroxybutyl acrylate in an amount of 7.5% by mass, respectively was prepared by living radical polymerization. 75 mol % of the hydroxy group as a constitutional unit derived from 4-hydroxybutyl acrylate of this acrylic triblock copolymer was bound with 2-methacryloyloxyethyl isocyanate, to obtain an acrylic polymer (Mw: 200,000, Mw/Mn: 3.19).

To 100 parts by mass of this acrylic polymer, 7.3 parts by mass of trimethylolpropane adduct tolylene diisocyanate (a product name: Coronate L, manufactured by Tosoh Corporation) as a crosslinking agent and 8.9 parts by mass of 2,2-dimethoxy-1,2-diphenylethan-1-one (a product name: Irgacure 651, manufactured by BASF SE) as a photopolymerization initiator were added, and the mixture was regulated with toluene in a solid content concentration of 20% by mass and stirred for 30 minutes, to obtain a diluted liquid of pressure sensitive adhesive. Thereafter, a sheet for semiconductor processing was produced in the same procedures as in Example 1. The storage elastic modulus of the pressure sensitive adhesive layer at 23° C. was $6.9 \times 10^4$ Pa.

TABLE 1

| | Tensile evaluation | | | | |
| --- | --- | --- | --- | --- | --- |
| | Stress at rupture (MPa) | Elongation at rupture (%) | Adhesive crack | Adhesive residue of bump part | Stain-like residue |
| Example 1 | 10 | 56 | B | B | A |
| Example 2 | 12 | 37 | A | A | A |

TABLE 1-continued

| | Tensile evaluation | | | | |
|---|---|---|---|---|---|
| | Stress at rupture (MPa) | Elongation at rupture (%) | Adhesive crack | Adhesive residue of bump part | Stain-like residue |
| Example 3 | 15 | 35 | A | A | A |
| Example 4 | 19 | 31 | A | A | A |
| Comparative Example 1 | 1 | 32 | C | C | C |
| Comparative Example 2 | 9 | 20 | C | C | A |

In the light of the above, in Examples 1 to 4, since the unevenness-absorbing layer was provided on the base, and the pressure sensitive adhesive layer with high stress at rupture and elongation at rupture was provided on the unevenness-absorbing layer, not only the adhesive crack of the pressure sensitive adhesive layer could be inhibited, but also the adhesive residue on the bump could be reduced. In addition, in view of the fact of using an acrylic polymer with a low molecular weight distribution for the pressure sensitive adhesive layer, the stain-like residue could be inhibited.

On the other hand, in Comparative Examples 1 and 2, since the stress at rupture of the pressure sensitive adhesive layer provided on the unevenness-absorbing layer was less than 10 MPa, the adhesive crack of the pressure sensitive adhesive layer was generated, and the adhesive residue on the bump could not be reduced.

The invention claimed is:

1. A sheet for semiconductor processing, comprising:
    a base;
    an unevenness-absorbing layer provided on one surface of the base; and
    a pressure sensitive adhesive layer provided on the unevenness-absorbing layer,
    wherein:
    the pressure sensitive adhesive layer comprises an energy-ray curable pressure sensitive adhesive;
    the energy-ray curable pressure sensitive adhesive comprises an acrylic polymer having a weight average molecular weight of 1,500,000 or less, wherein the acrylic polymer is a block copolymer having a structure represented by the formula (1), in which a polymer block (B) is bound to both ends of an acrylic polymer block (A):

(B)-(A)-(B)　　(1);

the energy-ray curable pressure sensitive adhesive does not contain an energy-ray curable compound other than the acrylic polymer; and
    a stress at rupture of the pressure sensitive adhesive layer after energy ray curing is 10 MPa or more.

2. The sheet according to claim 1, wherein an elongation at rupture of the pressure sensitive adhesive layer after energy ray curing is 30% or more.

3. The sheet according to claim 1, wherein a molecular weight distribution Mw/Mn of the acrylic polymer is 3.0 or less.

4. The sheet according to claim 1, wherein a storage elastic modulus of the unevenness-absorbing layer at 60° C. is from 0.001 to 0.5 MPa.

5. The sheet according to claim 1, wherein a storage elastic modulus of the unevenness-absorbing layer at 25° C. is from 4.5 to 65 MPa.

6. The sheet according to claim 1, which is a back grinding sheet.

7. A method for producing the sheet of claim 1, the method comprising:
    (1) forming the acrylic polymer as a block copolymer having a structure represented by formula (1):

(B)-(A)-(B)　　(1), by a process comprising: (i) performing a living radical polymerization comprising radical polymerizing a composition (a) comprising an alkyl (meth)acrylate (A1) to obtain an acrylic polymer block (A), and radical polymerizing a composition (b) comprising a functional-group-containing (meth)acrylate (B1) to obtain a polymer block (B) bound to both ends of the acrylic polymer block (A); and (ii) reacting functional groups of the polymer block (B) with at least one unsaturated group-containing compound (C); and
    (2) applying the energy-ray curable pressure sensitive adhesive layer formed of the acrylic polymer to the unevenness-absorbing layer provided on the one surface of the base, to obtain the sheet for semiconductor processing.

* * * * *